(12) United States Patent
Kuruc et al.

(10) Patent No.: US 10,134,886 B2
(45) Date of Patent: *Nov. 20, 2018

(54) INSULATED GATE BIPOLAR DEVICE AND MANUFACTURING METHOD THEREOF

(71) Applicant: SEMICONDUCTOR COMPONENTS INDUSTRIES, LLC, Phoenix, AZ (US)

(72) Inventors: Marian Kuruc, Piestany (SK); Juraj Vavro, Piestany (SK)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/657,842

(22) Filed: Jul. 24, 2017

(65) Prior Publication Data

US 2017/0323958 A1 Nov. 9, 2017

Related U.S. Application Data

(62) Division of application No. 15/175,166, filed on Jun. 7, 2016, now Pat. No. 9,768,285.

(Continued)

(51) Int. Cl.
*H01L 29/739* (2006.01)
*H01L 29/04* (2006.01)
(Continued)

(52) U.S. Cl.
CPC ...... *H01L 29/7397* (2013.01); *H01L 21/2253* (2013.01); *H01L 21/26513* (2013.01); *H01L 21/324* (2013.01); *H01L 29/04* (2013.01); *H01L 29/0638* (2013.01); *H01L 29/0834* (2013.01); *H01L 29/66348* (2013.01); *H01L 29/32* (2013.01); *H01L 29/417* (2013.01)

(58) Field of Classification Search
CPC ............. H01L 29/7397; H01L 29/0834; H01L 29/66384; H01L 29/7395; H01L 29/1095; H01L 29/66325; H01L 29/7393; H01L 21/2253; H01L 21/324
See application file for complete search history.

(56) References Cited

U.S. PATENT DOCUMENTS 5,444,271 A * 8/1995 Kuwahara ........... H01L 29/0834
257/136
6,309,920 B1 * 10/2001 Laska ................. H01L 29/7395
257/263

(Continued)

FOREIGN PATENT DOCUMENTS

JP 06069509 A 3/1994

*Primary Examiner* — Benjamin Sandvik
*Assistant Examiner* — Farid Khan
(74) *Attorney, Agent, or Firm* — Kevin B. Jackson

(57) ABSTRACT

In one embodiment, an IGBT is formed to include a region of semiconductor material. Insulated gate structures are disposed in region of semiconductor material extending from a first major surface. An n-type field stop region extends from a second major surface into the region of semiconductor material. A p+ type polycrystalline semiconductor layer is disposed adjacent to the field stop region and provides an emitter region for the IGBT. An embodiment may include a portion of the p+ type polycrystalline semiconductor being doped n-type.

14 Claims, 4 Drawing Sheets

Related U.S. Application Data

(60) Provisional application No. 62/308,971, filed on Mar. 16, 2016.

(51) Int. Cl.

| | | |
|---|---|---|
| *H01L 29/06* | (2006.01) | |
| *H01L 21/265* | (2006.01) | |
| *H01L 21/324* | (2006.01) | |
| *H01L 21/225* | (2006.01) | |
| *H01L 29/66* | (2006.01) | |
| *H01L 29/08* | (2006.01) | |
| H01L 29/32 | (2006.01) | |
| H01L 29/417 | (2006.01) | |

(56) References Cited

U.S. PATENT DOCUMENTS

| | | |
|---|---|---|
| 6,482,681 B1 | 11/2002 | Francis et al. |
| 6,683,343 B2 | 1/2004 | Matsudai et al. |
| 6,707,111 B2 | 3/2004 | Francis et al. |
| 6,825,110 B2 | 11/2004 | Linder et al. |
| 7,538,412 B2 | 5/2009 | Schulze et al. |
| 7,645,659 B2 | 1/2010 | Yun et al. |
| 7,842,590 B2 | 11/2010 | Gutt et al. |
| 8,084,814 B2 | 12/2011 | Nemoto et al. |
| 2002/0079534 A1 | 6/2002 | Kang et al. |
| 2002/0117712 A1 | 8/2002 | Matsudai et al. |
| 2003/0143836 A1 | 7/2003 | Linder et al. |
| 2007/0120181 A1* | 5/2007 | Ruething ............. H01L 29/0834 257/328 |
| 2007/0120215 A1 | 5/2007 | Yun et al. |
| 2008/0001257 A1 | 1/2008 | Schulze et al. |
| 2008/0308838 A1 | 12/2008 | McNutt et al. |
| 2009/0085103 A1* | 4/2009 | Hille ................... H01L 29/0619 257/330 |
| 2009/0184340 A1 | 7/2009 | Nemoto et al. |
| 2010/0078774 A1 | 4/2010 | Hirler |
| 2010/0317158 A1 | 12/2010 | Yilmaz et al. |
| 2011/0193132 A1* | 8/2011 | Kouno ................ H01L 29/0619 257/139 |
| 2012/0319163 A1* | 12/2012 | Tsuzuki ................ H01L 21/263 257/140 |
| 2014/0070268 A1 | 3/2014 | Yoshimura et al. |
| 2014/0167143 A1* | 6/2014 | Schmidt ............ H01L 21/26586 257/329 |
| 2015/0123165 A1* | 5/2015 | Omura ................ H01L 29/4236 257/139 |
| 2015/0200247 A1* | 7/2015 | Schmidt ............ H01L 29/66348 257/140 |
| 2016/0043073 A1* | 2/2016 | Tamura ............... H01L 27/0664 257/140 |
| 2016/0268181 A1* | 9/2016 | Yasuhara ................ H01L 29/51 |
| 2016/0300938 A1* | 10/2016 | Tonari .................... H01L 29/78 |
| 2017/0025410 A1* | 1/2017 | Cheng ................ H01L 27/0727 |
| 2017/0250269 A1* | 8/2017 | Sumitomo .......... H01L 29/7397 |

\* cited by examiner

INSULATED GATE BIPOLAR DEVICE AND MANUFACTURING METHOD THEREOF

CROSS-REFERENCE TO RELATED APPLICATIONS

The present application is a divisional application of U.S. patent application Ser. No. 15/175,166 filed on Jun. 7, 2016 and issued as U.S. Pat. No. 9,768,285 on Sep. 19, 2017, which claims the benefit of priority from U.S. Provisional Application No. 62/308,971 filed on Mar. 16, 2016, both of which are incorporated by reference herein and priority thereto is hereby claimed.

BACKGROUND

The present invention relates, in general, to electronics and, more particularly, to semiconductor device structures and methods of manufacture.

An Insulated Gate Bipolar Transistor ("IGBT") is a minority-carrier semiconductor device with high input impedance and large bipolar current-carrying capability. Many designers favorably view the IGBT as a power semiconductor device combining the high-speed switching characteristic of a high-power metal oxide silicon field effect transistor ("MOSFET") and the high-power characteristic of a bipolar junction transistor ("BJT").

A field stop IGBT ("FS-IGBT") is a known type of IGBT. FS-IGBT devices have used an N-type layer (i.e., a field stop layer) placed between a P-type collector region and an N-type drift region so as to prevent the expansion of the device depletion region into the P-type emitter region. Since the field stop layer typically is formed using ion implantation or diffusion processes, a high-energy ion implantation process or a wafer thinning process is required before the forming of the field stop layer. Also, the process to form the IGBT includes forming the N-type drift layer on the field stop layer and forming a double diffused MOSFET (DMOS) operation on the N-type drift layer. These processes are performed on very-thin wafers, which are fragile and are prone to warp or break during manufacturing steps, such as ion implantation, annealing and photolithography. Additionally, in some cases the manufacturing of FS-IGBT devices has required the use of epitaxially formed layers, very high energy ion implants, proton implantation, and laser annealing, which have added to manufacturing costs and equipment complexity.

Accordingly, it is desirable to have an IGBT structure and method that has a lower manufacturing cost and that overcomes the manufacturing issues noted above as well as others.

Figure 1:
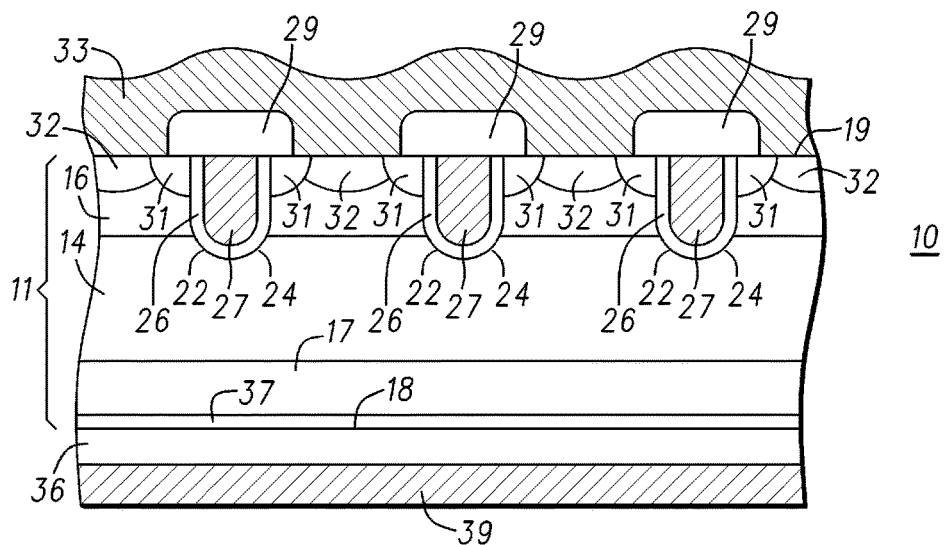
FIG. 1 illustrates an enlarged partial cross-sectional view of semiconductor device in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a method of manufacturing a semiconductor device having a polycrystalline semiconductor layer configured as a p+ region or emitter region on one major surface and a plurality of insulated gate structures on an opposing major surface. The polycrystalline p+ region is disposed adjacent to a field stop region of the semiconductor device and can be incorporated into the semiconductor device structure at an early stage of fabrication to improve manufacturability of the semiconductor device. Preferably, the polycrystalline region can be doped p+ later in the fabrication sequence after most or nearly all of the thermal budget has been used. Since the polycrystalline semiconductor layer remains as part of the semiconductor device, one or more removal steps are avoided and the manufacturability of the semiconductor device is improved.

More particularly, in one embodiment a method for forming a semiconductor device comprises providing a first substrate having a first major surface and a second major surface opposed to the first major surface. The method includes forming a first doped region of a first conductivity type extending from the first major surface into the first substrate. The method includes providing a polycrystalline semiconductor layer adjacent to the first major surface. The method includes providing a second substrate having a dielectric layer disposed proximate to an outer surface. The method includes attaching the second substrate to the first substrate such that the dielectric layer adjoins the polycrystalline semiconductor layer. The method includes forming insulated gate structures adjacent the second major surface of the first substrate. The method includes removing the second substrate to expose at least a portion of the dielectric layer. The method includes removing at least a portion of the dielectric layer to expose at least a portion of the polycrystalline semiconductor layer. The method includes doping at least a portion of the polycrystalline semiconductor layer with a dopant of a second conductivity type. The method includes forming a first electrode layer electrically coupled to the polycrystalline semiconductor layer, wherein the polycrystalline semiconductor layer provides an emitter region for the semiconductor device.

In another embodiment, an IGBT semiconductor device comprises a region of semiconductor material having a first major surface and a second major surface opposed to the first major surface. Insulated gate structures are disposed in the region of semiconductor material extending from the second major surface. A field stop region of a first conductivity type is disposed extending from the first major surface into the region of semiconductor material. A polycrystalline semiconductor layer is disposed adjacent to the first major surface. The polycrystalline semiconductor comprises a first portion of a second conductivity type adjoining the first major surface to provide an emitter region for the IGBT semiconductor device. A first electrode layer is electrically coupled to the polycrystalline semiconductor layer.

In a further embodiment, a method for forming a semiconductor device comprises providing a region of semiconductor material having a first major surface and a second major surface opposed to the first major surface. The method includes in either order forming a first doped region of a first conductivity type extending from the first major surface into the region of semiconductor material, and forming a polycrystalline semiconductor layer adjacent to the first major surface. The method includes thereafter forming insulated gate structures disposed in the region of semiconductor material extending from the second major surface, doping the polycrystalline semiconductor comprising at least a first portion of a second conductivity adjoining the first major surface, and forming a first electrode layer electrically coupled to the polycrystalline semiconductor layer.

FIG. 1 illustrates an enlarged partial cross-sectional view of a semiconductor device 10 in accordance with a first embodiment. In accordance with one embodiment, semiconductor device 10 is an FS-IGBT configured to withstand a high reverse voltage of at least approximately six hundred volts (600V). In one embodiment, semiconductor device 10 includes a region of semiconductor material 11 or body of semiconductor material 11 having a first major surface 18 and an opposing second major surface 19. In some embodiments, region of semiconductor material 11 comprises an n-type drift region 14 or doped region 14, a p-type doped region 16 or doped region 16 adjacent major surface 19, and n-type field-stop region 17 or doped region 17 adjacent to major surface 18. In one embodiment, doped region 14 is a high resistivity n-type region having a thickness in range from approximately 50 microns to about 65 microns. It is understood that the thickness of doped region 14 can be increased or decreased depending on the electrical requirements of semiconductor device 10. By way of example, doped region 14 has a resistivity of approximately 800 ohm-cm or a dopant concentration in range from approximately $4.0 \times 10^{13}$ atoms/cm$^3$ through $7.0 \times 10^{13}$ atoms/cm$^3$. In one embodiment as will be described later, doped region 14 can be formed using a (100) float zone ("FZ") substrate.

Doped region 16 has a conductivity type that is opposite to doped region 14, and is configured in most embodiments as a body region or a PHV region for semiconductor device 10. Doped region 16 has a peak doping concentration that is greater than the dopant concentration of drift region 14. In some embodiments, doped region 16 has a peak dopant concentration in range from approximately $2.0 \times 10^{16}$ atom/cm$^3$ through $5.0 \times 10^{17}$ atoms/cm$^3$ and a thickness or depth in a range from approximately 1 micron through 7 microns. Doped region 17 has as conductivity type that is opposite to doped region 16 and is configured as a field-stop region. Doped region 17 has a peak dopant concentration that is greater than doped region 14. In one embodiment, doped region 17 has a peak dopant concentration in range from approximately $5.0 \times 10^{15}$ atom/cm$^3$ through $5.0 \times 10^{16}$ atoms/cm$^3$ and a thickness or depth in a range from approximately 5 microns through 15 microns. Doped regions 16 and 17 can be formed using ion implantation and diffusion/anneal techniques or other doping techniques as known to those of skill in the art. In some embodiments, multiple ion implants are used to form doped regions 16 and 17.

Semiconductor device 10 further includes a plurality of insulated gate electrode structures 22 disposed adjacent to major surface 19. In some embodiments, insulated gate electrode structures 22 comprise a trench 24 extending from major surface 19 into doped regions 16 and 14, a gate dielectric layer 26 disposed on surfaces of trench 24, and a conductive gate electrode 27 disposed on gate dielectric layer 26. Dielectric regions 29 are disposed on conductive gate electrodes 27, and in some embodiments comprise oxide material(s). Semiconductor device 10 further includes doped region 31 or doped regions 31, which have a conductivity type opposite to doped region 16 and doped region 32 or doped regions 32, which have the same conductivity type as doped region 16. In the present embodiment, doped regions 31 are configured as n-type source regions and are formed adjacent to insulated gate electrode structures 22 and proximate to major surface 19. In the present embodiment, doped regions 32 are configured as p-type enhancement regions formed adjacent doped region 31 and major surface 19. Doped regions 31 and 32 can be formed using ion implantation and anneal techniques or other doping techniques as known to those of skill in the art.

A conductive electrode layer 33 or conductive electrode 33 is disposed over major surface 19 and electrically connects to doped region 16 and doped regions 31. In some embodiments, conductive electrode 33 is a metal material, such as aluminum, an aluminum alloy, titanium-nickel-silver, chrome-nickel-gold, or other conductive materials known those of skill in the art. Although not illustrated, another conductive electrode can be disposed over another portion of major surface 19 that is configured to electrically connect to conductive gate electrodes 27, which can comprise the same material(s) as conductive electrode 33.

In accordance with the present embodiment, semiconductor device 10 further includes a polycrystalline semiconductor layer 36 or a polycrystalline semiconductor region 36 disposed over major surface 18. In one embodiment, polycrystalline semiconductor layer 36 adjoins major surface 18. More particularly, polycrystalline semiconductor layer 36 is disposed on a polished surface of body of semiconductor material 11. In one embodiment, polycrystalline semiconductor layer 36 comprises polysilicon that can be an as-doped layer or can be subsequently doped after the layer is formed as well as later in the fabrication process of semiconductor device 10. In one embodiment, polycrystalline semiconductor layer 36 is deposited using a plasma-enhanced chemical vapor deposition ("PECVD") process, and can have a thickness in a range from approximately 1,000 Angstroms through 20,000 Angstroms. In one preferred embodiment, polycrystalline semiconductor layer 36 has a thickness in a range from approximately 3,000 Angstroms through 5,000 Angstroms. In other embodiments, polycrystalline semiconductor layer 36 can be formed by depositing an amorphous semiconductor layer, such as an amorphous silicon layer, and then can be subjected to a recrystallization process (for example, an annealing process) to convert the deposited layer to a polycrystalline material, such as polysilicon. In other embodiments, polycrystalline semiconductor layer 36 may be deposited using chemical vapor deposition ("CVD") techniques.

In accordance with the present embodiment, polycrystalline semiconductor layer 36 is configured as an injecting region or emitter region for semiconductor device 10. More particularly, polycrystalline semiconductor layer 36 provides the emitter region of a PNP transistor portion of semiconductor device 10 formed by doped region 16, doped regions 14 and 17, and polycrystalline semiconductor layer 36. In one embodiment, polycrystalline semiconductor layer 36 has the same conductivity type as doped region 16. In one embodiment, polycrystalline semiconductor layer 36 is a p-type region. In other embodiments as will be described later, polycrystalline semiconductor layer 36 comprises a first portion that is p-type to form the emitter region and a second portion that is n-type. Both the first portion and the second portion adjoin major surface 18 such that the p-type dopant in the first portion extends through polycrystalline semiconductor layer 36 to or beyond major surface 18 and the n-type dopant in the second portion extends through polycrystalline semiconductor layer 36 to or beyond major surface 18. In one embodiment, polycrystalline semiconductor layer 36 (or at least the p-type portion) is doped using ion implantation. For example, boron can be implanted into polycrystalline semiconductor layer 36 in one or more ion implants with doses in a range from approximately $1.0 \times 10^{12}$ atoms/cm$^2$ through $1.0 \times 10^{16}$ atoms/cm$^2$ with ion implant energies in range from approximately 1 kilo-electron volt (keV) through 1 mega-electron volt (MeV). The implanted dopant can be annealed using a furnace anneal with a temperature range from approximately 400 degrees Celsius (° C.) through 600° C. In other embodiments, the dopant is annealed using laser annealing techniques or other techniques as known to those of skill in the art.

In one embodiment, a portion of the p-type dopant is intentionally placed within doped region 17 to form a doped region 37 adjacent to major surface 18. By way of example, higher energy ion implants are used to form doped region 37 through polycrystalline semiconductor layer 36. In other embodiments, p-type dopant from polycrystalline semiconductor layer 36 is diffused into doped region 17 to form doped region 37.

A conductive electrode layer 39 or conductive electrode 39 is disposed over or adjacent to polycrystalline semiconductor layer 36. In one embodiment, conductive electrode 39 adjoins polycrystalline semiconductor layer 36. Conductive electrode 39 comprises a conductive material, such as a metal. By way of example, conductive electrode 39 comprises aluminum, aluminum-titanium-nickel-silver, aluminum-titanium-nickel-gold, or other conductive materials as known to those of skill in the art. Conductive electrode layers 36 and 39 can be formed using, for example, evaporation, sputtering, or other deposition techniques as known to those of skill in the art.

Although not shown, it is understood that semiconductor device 10 is typically provided with edge termination structures or isolation structures, such as insulated trench isolation structures, diffused isolations, or other termination structures as known to those of skill in the art.

Figure 2:
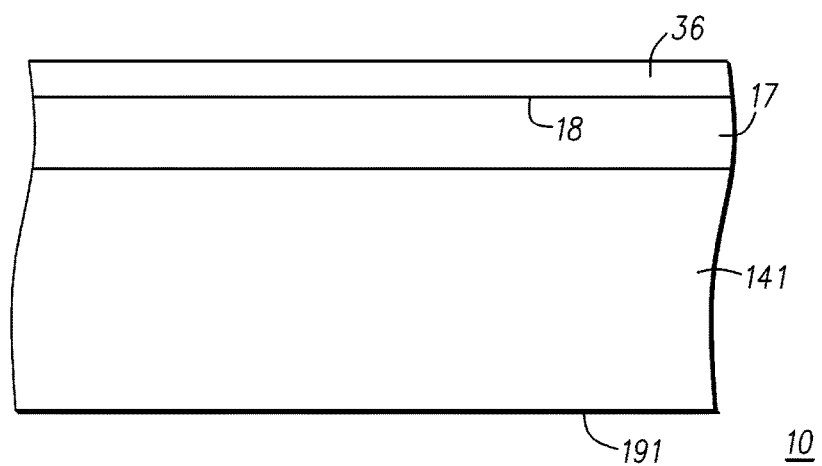
FIGS. 2-7 illustrate enlarged partial cross-sectional views of the semiconductor device of FIG. 1 at various stages of fabrication in accordance with an embodiment of the present invention.

FIGS. 2-9 illustrate partial cross-sectional views of semiconductor device 10 at various stages of fabrication in accordance with an embodiment of the present description. FIG. 2 illustrates a partial cross-sectional view of semiconductor device 10 at an early fabrication step. In one embodiment, a substrate 141 is provided, which can be a high resistivity FZ substrate approximately 300 microns through approximately 600 microns thick. By way of example, substrate 141 is an 80 ohm-cm (100) n-type substrate. In other embodiments, substrate 141 comprises a substrate formed using the Czochralski ("CZ") process. Substrate 141 includes major surface 18 and an opposing major surface 191. In one embodiment, a dielectric layer (not shown) is disposed over major surface 18. By way of example, a thermal oxide layer having a thickness of approximately 300 Angstroms is provided. A dopant step is then used to form doped region 17 extending inward from major surface 18. In one embodiment, ion implantation is used with one or more n-type dopants (for example, phosphorous, arsenic, and/or antimony) implanted with one or more implants through the dielectric layer into substrate 141. In another embodiment, the n-type dopant(s) is introduced into substrate 141 by diffusing the dopant from a doped dielectric layer, such as a doped oxide layer. In other embodiments, a combination of implants and a doped dielectric layer is used. In a still further embodiment, doped region 17 is formed using epitaxial growth techniques, in which case major surface 18 would be defined by doped region 17.

In one embodiment, the implanted dopant is annealed and diffused into substrate 141 to a desired depth to form doped region 17. In one embodiment, doped region 17 has depth in a range from approximately 1 micron through 5 microns. In one embodiment, doped region 17 has a peak dopant concentration of approximately $1.0 \times 10^{16}$ atoms/cm$^3$. The dielectric layer can then be removed using, for example, a wet etching process and then substrate 141 is cleaned for additional processing.

Polycrystalline semiconductor layer 36 is then formed over major surface 18. In one embodiment, plasma-enhanced CVD techniques are used to form layer 36 when polysilicon is used. In one embodiment, the polysilicon is formed at a temperature in range from approximately 600° C. through 630° C. and has a thickness in a range from approximately 3,000 Angstroms through 20,000 Angstroms. In one embodiment, polycrystalline semiconductor layer 36 has an as-formed dopant concentration. In other embodiments, polycrystalline semiconductor layer 36 is formed un-doped and is doped in subsequent steps. In the present description, polycrystalline semiconductor layer 36 is formed un-doped.

In other embodiments, polycrystalline semiconductor layer 36 is formed before doped region 17 is formed. By way of example, polycrystalline semiconductor layer 36 can be doped with an n-type dopant and the dopant diffused into substrate 141 to form doped region 17. By way of another example, n-type dopant can be ion implanted through polycrystalline semiconductor layer 36 into substrate 141, or multiple implants with varied doses and energies can be used.

Polycrystalline semiconductor layer 36 can be planarized after it is deposited using, for example, chemical mechanical planarization ("CMP") techniques or other planarization techniques as known to those of skill in the art. Optionally, a dielectric layer (not shown), such as oxide layer is disposed on the outer surface of polycrystalline semiconductor layer 36 before the planarization step. The dielectric layer can be a deposited layer or a portion of polycrystalline semiconductor layer 36 can be oxidized using a thermal oxidation process.

Figure 3:
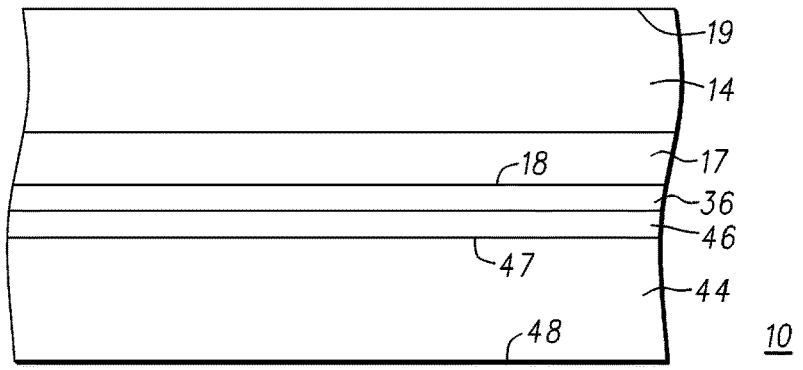

FIG. 3 illustrates a partial cross-sectional view of semiconductor device 10 after additional processing. In one embodiment, a substrate 44, handle substrate 44, or second substrate 44 is provided with an insulator layer 46 or a dielectric layer 46 disposed proximate to or on an outer surface 47 or major surface 47. Substrate 44 further includes another outer surface 48 or major surface 48 opposite to major surface 47. By way of example, substrate 44 may be a (100) high resistivity substrate having a thickness in a range from approximately 500 microns through 550 microns. In some embodiments, dielectric layer 46 can be a thermal oxide, a deposited oxide, a buried oxide, an ion implanted oxide, or other forms of oxide(s) as known to those of skill in the art. In one embodiment, dielectric layer 46 has a thickness in a range from approximately 2000 Angstroms through 15,000 Angstroms. In one embodiment, dielectric layer 46 is wafer bonded to polycrystalline semiconductor layer 36, and then a portion of substrate 141 is removed from major surface 119 to a desired thickness to provide doped region 14 having major surface 19. In one embodiment, grinding, etching and/or polishing techniques can be used to remove the portion of substrate 141. In a 600 volt embodiment, doped region 14 is provided with a thickness in a range from approximately 50 microns through 65 microns. It is understood that this thickness is increased or decreased depending on the desired electrical characteristics of semiconductor device 10. Major surface 19 may be etched and/or cleaned before further processing.

Figure 4:
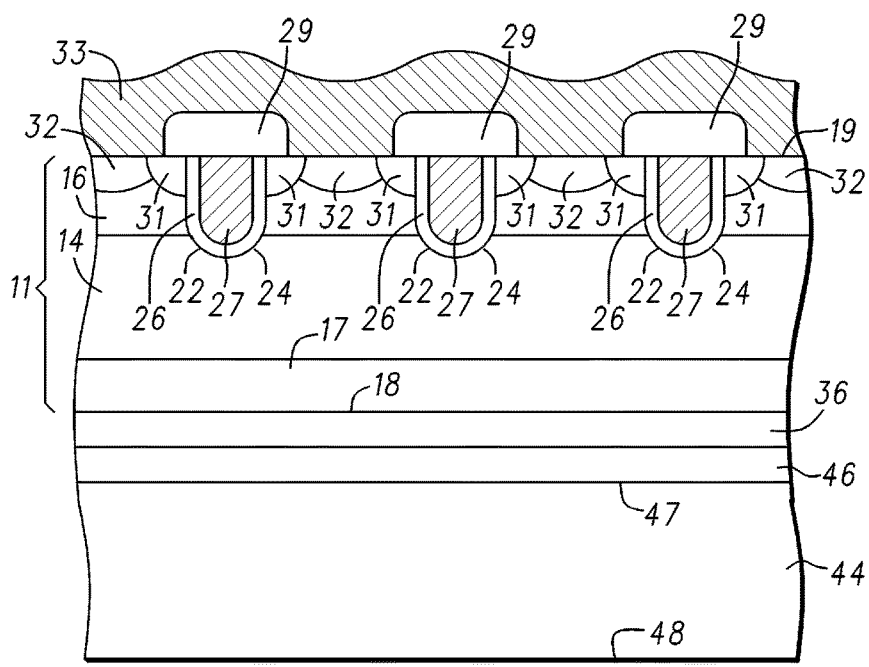

FIG. 4 illustrates a partial cross-sectional view of semiconductor device 10 after further processing. In one embodiment, doped region 16 is disposed within or on doped region 14. By way of example, p-type dopant is introduced and diffused from major surface 19 into doped region 14 to form doped region 16. In another embodiment, epitaxial growth techniques are used to form doped region 16, in which case major surface 19 would be defined by doped region 16. In accordance with the present embodiment, body of semiconductor material 11 comprises doped region 17, doped region 14, and doped region 16. Next, active devices and termination structures (not shown) are formed within doped region 16. In one embodiment, insulated gate electrode structures 22 including, for example, trenches 24, gate dielectric layers 26, and conductive gate electrodes 27 are formed adjacent major surface 19 and extend into doped region 14. Source regions 31 and formed adjacent insulated gate electrodes 22, dielectric regions 29 are formed to isolate conductive gate electrodes 27, and conductive electrode layer 33 is formed over major surface 19 including dielectric regions 29 so as to be in electrical communication with doped region 16 and source regions 31. Conductive electrode 33 can be patterned to provide both a first current carrying electrode portion electrically coupled to source regions 31 and a control electrode portion (not shown) electrically coupled to conductive gate electrodes 27. In embodiments where conductive electrode 33 comprises aluminum, subsequent processing temperatures must be kept sufficiently low enough so as to not detrimentally impact the aluminum layer and/or the electrical characteristics of semiconductor device 10. In accordance with the present embodiment, polycrystalline semiconductor layer 36 acts as a gettering layer during the formation of insulated gate electrode structures 22 and doped regions 31 and 32, as well as later forming the p+ layer or emitter region of semiconductor device 10 adjoining doped region 17.

Figure 5:
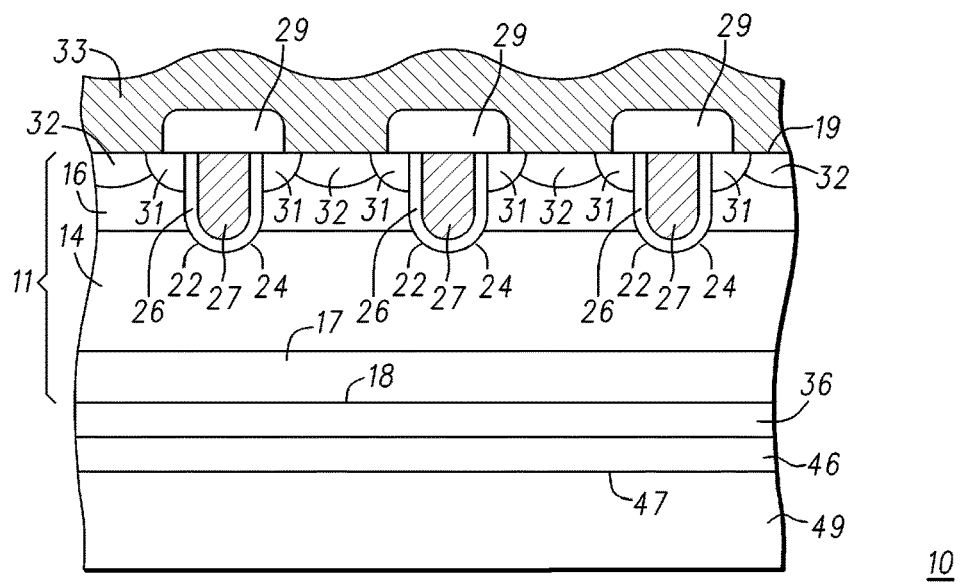

FIG. 5 illustrates a partial cross-sectional view of semiconductor device 10 after still further processing. In subsequent processing, a portion of substrate 44 is removed from major surface 48. In one embodiment, material from substrate 44 is removed leaving a portion 49 of substrate 44 left adjacent dielectric layer 46. In one preferred embodiment, portion 49 is approximately 5 microns to 15 microns thick. In one embodiment, Taiko removal techniques are used leaving an outer ring portion (not shown) of substrate 41 in place. In some embodiments, the edge portion is approximately 3 millimeters wide. Among other things, the Taiko removal process provides an interim structure having more stability that is less susceptible to breakage and related issues.

Figure 6:
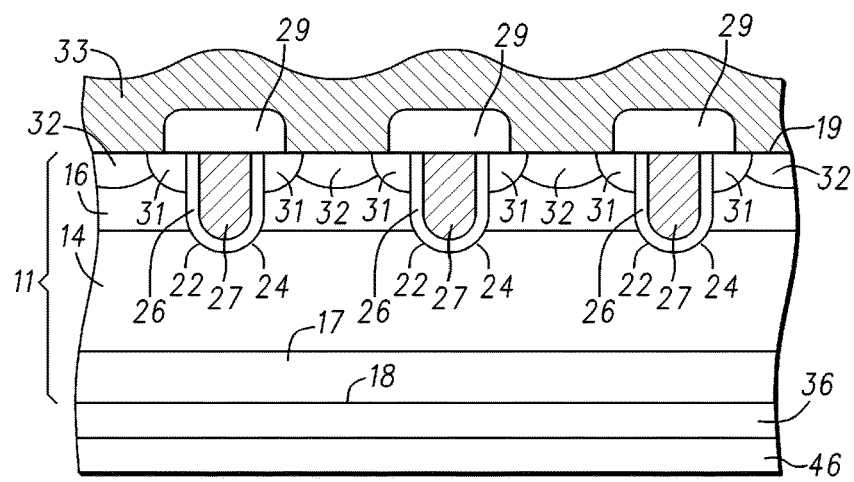

FIG. 6 illustrates a partial cross-sectional view of semiconductor device 10 after additional processing. In one embodiment, a selective removal process is used to remove portion 49 of substrate 41 thereby exposing dielectric layer 46 or at least a portion thereof. In one embodiment, a spin etch processor, such as a SEZ spin etch system is used to remove portion 49 thereby exposing dielectric layer 46. In one embodiment, a combination of hydrofluoric, nitric, and acetic acids are used to remove portion 49. In another embodiment, a hydroxide wet chemistry is used to remove portion 49. The side of semiconductor device 10 opposite to portion 49 can be protected using one or more masking materials configured to withstand the selected chemistry for removing portion 49. Such masking materials can include photoresists, polyimide, laminate materials, or other materials as known to those of skill in the art. The masking material further protects against scratches and particulates.

Figure 7:
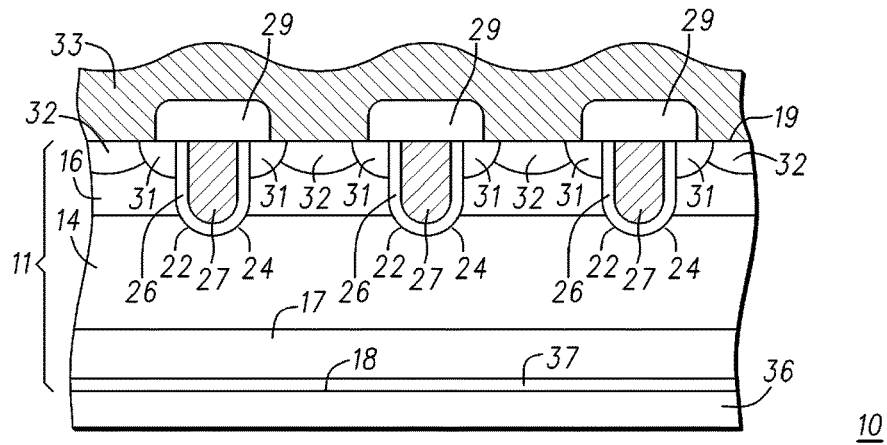

FIG. 7 illustrates a partial cross-sectional view of semiconductor device 10 after further processing. In one embodiment, a removal process is used to remove dielectric layer 46. In most embodiments, dielectric layer 46 is removed using an etching process. By way of example, when dielectric layer 46 comprises an oxide, a hydrofluoric acid process can be used to etch away dielectric layer 46. The masking material(s) described above or a different masking material preferably is used to protect the side of semiconductor device 10 opposite to dielectric layer 46 during the removal process. In accordance with one embodiment, after dielectric layer 46 is removed, polycrystalline semiconductor layer 36 is doped with a dopant having a conductivity type opposite to doped region 17 to form a polycrystalline doped region (e.g., p+ type) or emitter region for semiconductor device 10. In accordance with the present invention, because polycrystalline semiconductor layer 36 is used as the emitter region instead of further doping region of semiconductor material 11 adjoining major surface 18, the dopant profile of doped region 17 is better maintained and controlled. Also, because the polycrystalline semiconductor layer 36 remains as part of semiconductor device 10, hard to control removal steps, like polysilicon removal steps are avoided thereby improving, for example, the planarity of region of semiconductor material 11.

In one embodiment, polycrystalline semiconductor layer 36 is doped using ion implantation. For example, boron can be implanted into polycrystalline semiconductor layer 36 in one or more ion implants with doses in a range from approximately $1.0 \times 10^{12}$ atoms/cm$^2$ through $1.0 \times 10^{16}$ atoms/cm$^2$ with ion implant energies in range from approximately 1 keV through 1 MeV. In one preferred embodiment, polycrystalline semiconductor layer 36 has a peak dopant concentration of approximately $1.0 \times 10^{18}$ atoms/cm$^3$. The implanted dopant can be annealed using a furnace anneal with a temperature range from approximately 400 degrees Celsius (° C.) through 600° C. In other embodiments, the dopant is annealed using laser annealing techniques or other techniques as known to those of skill in the art.

In one embodiment, a portion of the p-type dopant is intentionally placed within doped region 17 to form a doped region 37 adjacent to major surface 18. By way of example, higher energy ion implants are used to form doped region 37 through polycrystalline semiconductor layer 36. In other embodiments, p-type dopant from polycrystalline semiconductor layer 36 is diffused into doped region 17 to form doped region 37.

In an alternative embodiment, other materials can be ion implanted into substrate 141 through major surface 18 to improve switching characteristics of semiconductor device 10 and/or to provide an additional field stop portion or layer. By way of example, one or more ion implantation steps can be used to implant phosphorous, arsenic, antimony, protons, helium, or other similar materials as known to those of skill in the art. Ion implant doses in a range from approximately $1.0 \times 10^{11}$ atoms/cm$^2$ through $1.0 \times 10^{16}$ atoms/cm$^2$ with ion implant energies in a range from approximately 1 keV through 20 MeV.

Figure 8:
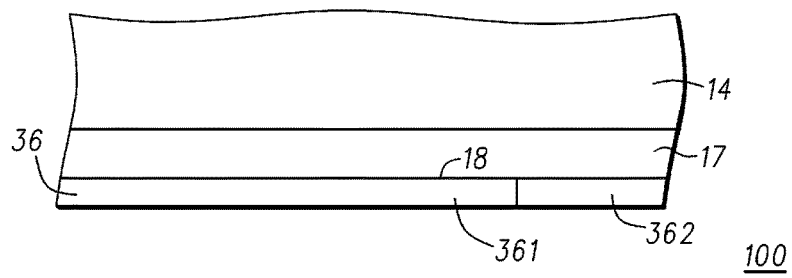
FIG. 8 illustrates an enlarged partial cross-sectional view of an alternative structure for a semiconductor device in accordance with the present invention.

FIG. 8 illustrates an enlarged partial cross-sectional view of a semiconductor device structure 100 in accordance with an alternative embodiment for polycrystalline semiconductor layer 36. In one embodiment, a masking layer (not shown) can be provided on an outer surface portion of polycrystalline semiconductor layer 36 and a first portion 361 doped p-type to form an emitter portion. Another masking layer (not shown) can be then provided over first portion 361 and a second portion 362 of polycrystalline semiconductor layer 36 doped with an n-type dopant. Both first portion 361 and second portion 362 adjoin major surface 18 such that the p-type dopant in first portion 361 extends through the polycrystalline semiconductor layer 36 to or beyond major surface 18 and the n-type dopant in second portion 362 extends through polycrystalline semiconductor layer 36 to or beyond major surface 18.

Figure 9:
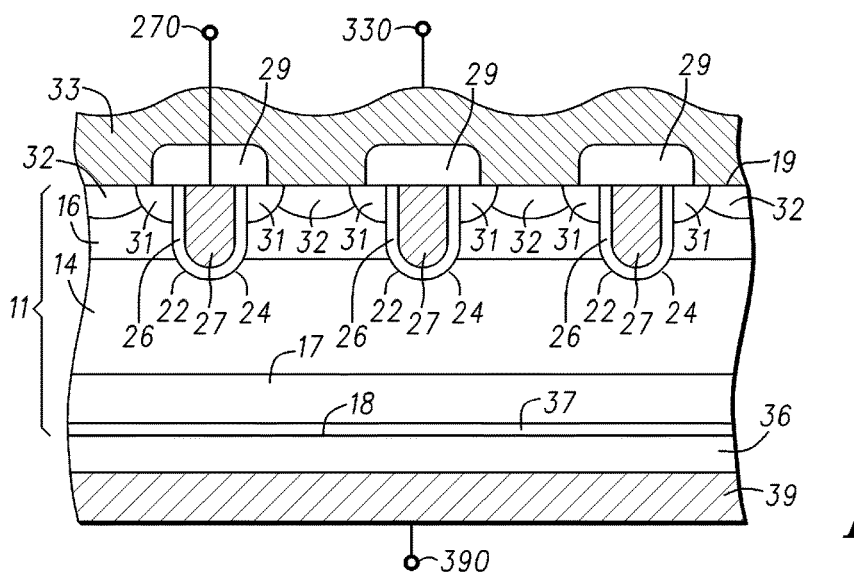
FIG. 9 illustrates an enlarged partial cross-sectional view of the semiconductor device of FIG. 1 at a further stage of fabrication in accordance with an embodiment of the present invention.

FIG. 9 illustrates an enlarged partial cross-sectional view of semiconductor device 10 after still further processing. In one embodiment, conductive electrode 39 is disposed over or adjacent to polycrystalline semiconductor layer 36. In one embodiment, conductive electrode 39 adjoins polycrystalline semiconductor layer 36. Conductive electrode 39 comprises a conductive material, such as a metal. By way of example, conductive electrode 39 comprises aluminum, aluminum-titanium-nickel-silver, aluminum-titanium-nickel-gold, or other conductive materials as known to those of skill in the art. As further illustrated in FIG. 9, conductive layer 39 provides a drain or anode electrode 390 for semiconductor device 10, conductive layer 33 provides a source or cathode electrode 330 for semiconductor device 10, and conductive gate electrodes 27 combine to provide a gate electrode 270 for semiconductor device 10. Further, polycrystalline semiconductor layer 36 was unexpectedly found to provide improved injection efficiency and improved recombination effects thereby improving the performance of the device.

From all of the foregoing, one skilled in the art can determine that, according to another embodiment, a method for forming a semiconductor device can include incorporating one or more of phosphorous, arsenic, antimony, protons, and helium into a first substrate (for example, element) through a first major surface (for example, element 18). In another embodiment, incorporating comprises implanting at an ion implant dose in a range from approximately $1.0 \times 10^{11}$ atoms/cm$^2$ through $1.0 \times 10^{16}$ atoms/cm$^2$ and with an ion implant energy in range from approximately 1 keV through 20 MeV. In a further embodiment, providing a first substrate can include providing a float zone semiconductor substrate. In a still further embodiment, forming a first doped region (for example, element 17) can include forming a second dielectric layer adjoining the first major surface; ion implanting a dopant into the first substrate adjacent the first major surface; and exposing the implanted dopant to an elevated temperature. In another embodiment, attaching a dielectric layer (for example, element 46) to the polycrystalline semiconductor layer (for example, element 36) comprises bonding the dielectric layer to the polycrystalline semiconductor layer. In a further embodiment, providing the polycrystalline semiconductor layer can comprise depositing an amorphous semiconductor layer; and exposing the amorphous semiconductor layer to a recrystallization process to form the polycrystalline semiconductor layer.

In view of all of the above, it is evident that a novel method and structure is disclosed. Included, among other features, providing a polycrystalline semiconductor layer configured as an injecting region or emitter region on a surface of semiconductor material that is opposite to the surface where active device portions are disposed. The polycrystalline semiconductor region improves the manufacturability of semiconductor device including, for example IGBT type devices. By way of example, the planarity of semiconductor regions is improved and etch-selective removal processes are supported. Additionally, the polycrystalline semiconductor layer improves the electrical performance of the semiconductor device. By way of example, injection efficiencies and recombination effects are enhanced.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, other semiconductor materials such as GaAs, GaN, SiC, diamond, Ge, CdTe, and the like may also be used. The material can be bulk substrate, homo-epitaxy or hetero-epitaxy of dissimilar semiconductors. Additionally, the described semiconductor device 10 may be a portion of another semiconductor device including, but limited to, an integrated power semiconductor device. Further, the described semiconductor device 10 may be provided with recessed contact structure contacting doped region 32 and/or may be provided with a JFET layer disposed below doped region 16 and adjoining insulated gate structures 22. Moreover, the described semiconductor device 10 may include planar insulated gate electrode structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method for forming a semiconductor device comprising:
    providing a first substrate having a first major surface and a second major surface opposed to the first major surface, a first doped region of a first conductivity type extending from the first major surface into the first substrate, and a polycrystalline semiconductor layer adjacent to the first major surface;
    providing a second substrate having a dielectric layer disposed proximate to an outer surface;
    attaching the second substrate to the first substrate such that the dielectric layer adjoins the polycrystalline semiconductor layer;
    forming insulated trench gate electrode structures extending inward from the second major surface of the first substrate;
    removing the second substrate to expose at least a portion of the dielectric layer;
    removing at least a portion of the dielectric layer to expose at least a portion of the polycrystalline semiconductor layer;
    doping the polycrystalline semiconductor layer with a dopant of a second conductivity type; and
    forming a first electrode layer electrically coupled to the polycrystalline semiconductor layer, wherein the polycrystalline semiconductor layer provides an emitter region for the semiconductor device.

2. The method of claim 1, wherein attaching comprises bonding the dielectric layer to the polycrystalline semiconductor layer.

3. The method of claim 1, wherein doping the polycrystalline semiconductor layer comprises:
    ion implanting the dopant of the second conductivity type into the polycrystalline semiconductor layer; and
    annealing the dopant.

4. The method of claim 3, wherein:
    ion implanting comprises using a plurality of ion implants; and
    at least one ion implant forms a second conductivity type doped region within the first substrate adjacent to the first major surface.

5. The method of claim 1, wherein forming the first doped region comprises diffusing dopant of the first conductivity type from the polycrystalline semiconductor layer into the first substrate.

6. The method of claim 1 further comprising planarizing the polycrystalline semiconductor layer before attaching the second substrate.

7. The method of claim 6 further comprising oxidizing the polycrystalline semiconductor layer before planarizing.

8. The method of claim 1 further comprising:
    incorporating one or more of phosphorous, arsenic, antimony, protons, and helium into the first substrate through the first major surface.

9. The method of claim 1, wherein providing the polycrystalline semiconductor layer comprises forming a polysilicon layer having a thickness in a range from approximately 1,000 Angstroms through 20,000 Angstroms.

10. The method of claim 1, wherein providing the polycrystalline semiconductor layer occurs before forming the first doped region.

11. The method of claim 1, wherein forming the insulated trench gate electrode structures comprises:
    forming a second doped region of the second conductivity type extending from the second major surface of the first substrate into the first substrate;
    forming the insulated trench gate electrode structures extending inward from the second major surface;
    forming source regions of the first conductivity type adjacent to the insulated trench gate electrode structures and within the second doped region; and
    forming a second electrode layer electrically coupled to the source regions.

12. The method of claim 1, wherein removing the second substrate comprises:
    grinding a first portion of the second substrate; and
    etching a second portion of second substrate to expose at least a portion of the dielectric layer.

13. The method of claim 1, wherein forming the first doped region comprises using a plurality of ion implants.

14. The method of claim 1, wherein:
doping the polycrystalline semiconductor layer comprises:
- doping a first portion of the polycrystalline semiconductor layer with the dopant having the second conductivity type, wherein the first portion provides the emitter region; and
- doping a second portion of the polycrystalline semiconductor layer with a second dopant having the first conductivity type, wherein the second portion and the first portion are laterally adjacent to each other so that the first electrode layer physically contacts both the first portion and the second portion.

\* \* \* \* \*